United States Patent [19]

Arato

[11] Patent Number: 4,528,497

[45] Date of Patent: Jul. 9, 1985

[54] METHOD AND APPARATUS FOR MONITORING GROUND FAULTS IN ISOLATED ELECTRICAL SYSTEMS

[75] Inventor: Gabor P. Arato, Toronto, Canada

[73] Assignee: Isolation Systems Limited, Ontario, Canada

[21] Appl. No.: 410,644

[22] Filed: Aug. 23, 1982

[51] Int. Cl.³ .................. G08B 21/00; G01R 31/02
[52] U.S. Cl. ........................... 324/51; 340/651
[58] Field of Search ............... 340/651; 179/175.3 F; 324/51, 52, 57 SS, 57 Q

[56] References Cited

U.S. PATENT DOCUMENTS 3,976,987  8/1976  Anger ............................ 340/651
4,206,398  6/1980  Janning ........................ 340/651 X Primary Examiner—Stanley T. Krawczewicz
Assistant Examiner—Jose M. Solis
Attorney, Agent, or Firm—George A. Rolston

[57] ABSTRACT

A device for monitoring ungrounded power distribution systems that indicates the total hazard current from the isolated power conductors to ground. A measurement signal having at least two frequency components different from the power system line frequency is applied across the combined fault impedances that occur between the power conductors and ground. Voltage responses to the measurement signal components are separated from the power system line voltage and from each other by frequency selective means. These distinct voltage responses are proportional to the fault admittance magnitude at the different measurement frequencies. The voltage responses are applied to the computational circuit whose output is proportional to the maximum fault admittance magnitude at the line frequency. A gain signal related to the imbalance of the fault impedances of the different power conductor is used to scale the previously described voltage responses. Thus, the output of the computation circuit is scaled to be proportional to the largest fault admittance on the distribution system which in turn is proportional to the total hazard current of the system.

19 Claims, 5 Drawing Figures

METHOD AND APPARATUS FOR MONITORING GROUND FAULTS IN ISOLATED ELECTRICAL SYSTEMS

The invention relates generally to a method and apparatus for monitoring ground faults in an ungrounded power distribution system. This invention provides a line isolation monitor that indicates the maximum current that would pass through a low impedance path connected between any power conductor and ground.

BACKGROUND OF THE INVENTION

An ideal ungrounded power distribution system would have an infinite impedance between all conductors and ground so that no current would flow to ground. In the ideal case, if a low impedance path were connected from one conductor to ground, no current would flow through the low impedance path to ground. There is no return path from ground to a power conductor, therefore no current can flow between the power system and ground.

However, in reality the impedances between the conductors and ground are actually finite, and are defined as fault impedances. In the realistic case, if a low impedance path is established from one conductor to ground by making a low impedance test connection therebetween, current can flow to ground. A return path is provided through the fault connections. The current that would pass through the low impedance test connection between a power conductor and ground is limited by fault impedances to ground of the other power conductors. Thus, a measure of the isolation from ground of an ungrounded power system is the current flowing through the test connection. The maximum current which can flow through the test connection is known as the hazard current. The hazard current is related to the minimum fault impedance of the system.

In a two conductor power distribution system, each conductor has an associated fault impedance. The low impedance test connection can be made between either conductor and ground. The hazard current is the largest current than will flow through the test connection in either one of these positions.

Fault impedance is defined in Underwriter's Laboratories Standard 1022 as, "an impedance that may consist of balanced or unbalanced resistive and capacitive, or combined resistive/capacitive loads to either or both isolated conductors". Balanced faults are equivalent fault impedances on both conductors. Similar type fault impedances of different magnitude are unbalanced faults. Dissimilar type fault impedances are hybrid faults. A combined resistive and capacitive fault impedance on the same conductor is denoted as an RC fault.

The total hazard current is measured with all devices connected, including line isolation monitors. The entire electrical system is known as an impedance network. Components of the total hazard current are the monitor hazard current, and the fault hazard current, that portion of the total hazard current resulting when all devices, except the line isolation monitors are connected.

A line isolation monitor (LIM) is used to supervise the total hazard current of an ungrounded power distribution system. In doing so, the monitor is required to be equally sensitive to any combination of fault impedances and to indicate on a scale the total hazard current and issue an alarm if this value exceeds a predetermined limit.

The monitor according to the invention is connected to the power conductors of an ungrounded power distribution system and ground reference, and will measure the maximum admittance to ground of any power conductor at the line frequency. Admittance is defined as the reciprocal of impedance. Therefore, the maximum admittance is proportional to the minimum impedance. Thus, the total hazard current is proportional to the maximum fault admittance. The characteristics of the line voltage across the ungrounded power distribution system are considered constant. Admittance is a complex vector value that may have frequency dependent components. Admittance can be measured directly by Ohm's Law at the frequency of interest by measuring the voltage response to a known current signal or conversely the current response to a known voltage signal. These responses, at the frequency of interest, if measured on an activated power system, could not be distinguished from the voltage across the fault admittance due to line voltage.

BRIEF SUMMARY OF THE INVENTION

The measurement of hazard current reduces to a special case of impedance measurement. The unknown fault impedances are known to be composed only of resistive and capacitive components. The impedance network is energized by a line voltage. The frequency of this line voltage defines the frequency at which the fault impedances, or inversely fault admittances, are to be determined.

Impedance can be measured by application of Ohm's Law. A known current applied to an impedance will have a voltage response, proportional to the impedance. Conversely, if the applied current is varied to obtain a fixed voltage response, the current will be inversely proportional to impedance and directly proportional to the admittance. The resistive component of impedance is resistance, which frequency independent. The capacitive impedance, however, is a function of frequency. Due to this frequency dependent capacitive component, fault impedance is a complex value having a vectorial relation of voltage and current. Because a fault impedance has an unknown combination of resistive and capacitive components, its relation to frequency cannot be predetermined. The separate measurement of each component of impedance at a known single frequency, and the compensation of the frequency dependent component to derive a fault impedance vector at any desired frequency is described by ANGER U.S. Pat. No. 3,976,987. Such a method is inherently dependent on phase shifts, within the monitor electronics, that must be well defined and constant. The disadvantages of such a method for monitoring fault impedance are that phase shift measurements may be difficult to calibrate and that a phase shift characteristic may vary with time.

It would therefore be advantageous if a method and apparatus to monitor fault impedance could be used that did not depend on the phase shift characteristics of various signals. It would be advantageous if the method and apparatus relied only on easily measured and controllable frequency and amplitude characteristics of various signals.

The present invention uses multiple measurement signals of known different frequencies, different from the line frequency and harmonically unrelated, to measure the fault admittance of the ungrounded distribution system at each of the measurement frequencies. These measured values of admittance at known frequencies are used to calculate the magnitude of the fault admittance at the line frequency. It is recognized that any number of measurement frequencies, greater than one, can be used. The preferred embodiment of the invention uses only two distinct frequencies non-harmonically related to the line frequency since any additional measurement frequencies would present redundant information.

A current amplifier outputs a controlled measurement signal, composed of two distinct frequencies, to the ungrounded distribution system. The dual frequency voltage response of the combined fault admittance, to the measurement signal is superimposed on the line voltage signal. The line voltage signal and its predominant harmonic are removed by frequency selective filtering means to separate the voltage response signal due to the composite measurement signal. Two independent circuit loops, each selective to one frequency, synchronously detect the two frequency components of the voltage response. Each loop has a gain control means which controls the sensitivity of the loop to the measured voltage response at the frequency for which the loop is set. In each loop the error voltage of a comparator is integrated to control the output amplitude of an oscillator set at the frequency of the loop. The amplitude controlled oscillator signals of the two loops are summed, filtered and applied to a current amplifier to produce the measurement signal. Each loop will reach a steady state when its fault admittance voltage response to the controlled current signal equals the gain voltage of that loop. Thus the integrated error voltage of each loop is proportional to the measurement current required to obtain a predetermined voltage response magnitude and therefore the fault admittance at the loop frequency. The proportionality is set by the gain voltage of the loop. The loop gain voltages are produced by a balance detector which outputs a signal proportional to the gain factor, or unbalance of the fault admittances. The gain voltage controls each loop so that the loop gain for a single sided fault is twice the gain for a balanced fault. Therefore, the integrated error voltage of each loop becomes proportional to each of the two line fault admittances at the loop frequency rather than the combined fault admittance as seen by the measurement signal.

These error voltage signals, proportional to the maximum fault admittance at the two known frequencies, are applied to a computation means, having predetermined constants, that provides an output signal proportional to the maximum fault admittance at the line frequency. This signal drives the display proportional to the total hazard current and actuates the alarm circuitry and associated audible and visual alarms if a limit is exceeded.

This method can be applied to ungrounded power distribution systems with any number of power conductors. The preferred embodiment of the invention describes the case of a two conductor ungrounded system. It is also recognized that the line frequency can be of any value including direct current (zero frequency).

An object of the present invention is to provide a method and device that continuously monitors the fault admittances of an ungrounded power distribution system.

Another object is to provide a line isolation monitor (LIM) that contributes a very low monitor hazard current.

Another object is to provide a LIM that, by the use of measurement signals at least one frequencies different from the line frequency, is responsive to the maximum fault admittance at the line frequency.

Another object is to provide a LIM that is not sensitive to the phase component of the fault admittances, and therefore, does not require the control of or response to phase shift characteristics.

Another object is to provide a LIM that, in its measurement of fault admittance, does not cause noise or distortion that would affect other equipment connected to the ungrounded power distribution system.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

IN THE DRAWINGS

THEORY OF OPERATION

Figure 3:
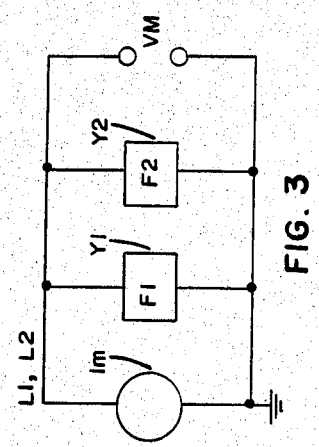
FIG. 3 is a block diagram derived from FIG. 2 showing one signal measured by the LIM, due to the ungrounded power supply.

In the present invention, the magnitude of the combined complex fault admittance is measured at two frequencies not harmonically related to each other or the line frequency. It will be shown that from these two measured values, the magnitude of the combined complex fault admittance at the line frequency can be derived. The magnitude of the hazard current is relevant but its phase is not. The magnitude of the hazard current, $/I_H/$, is a function of the line voltage, $V_L$, and the magnitude of the maximum fault admittance, $/Y_{MAX}/$. Since line voltage, $V_L$, is constant, in the circuit under consideration, the relationship can be described as follows:

$$/I_H/ = /V_L/ \times /Y_{MAX}/ \tag{1}$$

Since the LIM is measuring fault admittances of the entire ungrounded power distribution system, all fault admittances on each conductor appear as a single fault admittance, $Y_1$ or $Y_2$.

However, since the LIM in fact sees the fault admittances on both conductors in parallel, it is in fact measuring a single combined fault admittance, $Y_F$.

The fault admittances comprise both capacitive and resistive components, in parallel. Since both conductor's fault admittances are measured in parallel, the combined fault admittance can be considered as a single parallel RC circuit.

In a parallel RC circuit, the magnitude of admittance Y is defined as:

$$/Y/ = (G^2 + (2\pi f C)^2)^{\frac{1}{2}}. \quad (2)$$

Where G is the inverse of resistance, C is capacitance, and f is the frequency of excitation. From this general equation we can define the magnitude of the combined fault admittance at the two measurement frequencies, $f_A$ and $f_B$, and the line frequency of $f_F$ as $/Y_A/$, $/Y_B/$ and $/Y_F/$, respectively. The relationship of the magnitudes of the fault admittance to its components at the measurement and line frequencies are:

$$/Y_A/^2 = G^2 + (2\pi f_A C)^2, \quad (3)$$

$$/Y_B/^2 = G^2 + (2\pi f_B C)^2, \quad (4)$$

$$/Y_F/^2 = G^2 + (2\pi f_F C)^2, \quad (5)$$

There are three unknowns in these three equations; $Y_F$, G and C. All other terms in the equations are either known constants; $f_A$, $f_B$ and $f_F$, or variable values; $/Y_A/$ and $/Y_B/$, that are measured directly by the LIM. Therefore, these equations can be reduced to solve for $/Y_F/$ in terms of $/Y_A/$ and $/Y_B/$ where;

$$/Y_F/ = (/Y_A/^2 + (/Y_A/^2 - /Y_B/^2)K)^{\frac{1}{2}}, \quad (6)$$

and, $$K = (f_F^2 - f_A^2)/(f_A^2 - f_B^2) \quad (7)$$

is a constant determined by the known frequencies and measured admittance magnitudes. It is recognized that this relationship can be computed by either digital or analog electronic means. It is further recognized that such computation means can be hardwired or software controlled. It is further recognized that a measurement signal or a line voltage that is DC (ie. 0 frequency) can be solved by equation (6) by setting $f_A$, $f_B$ or $f_F$ equal to 0, as the case may be.

Figure 1:
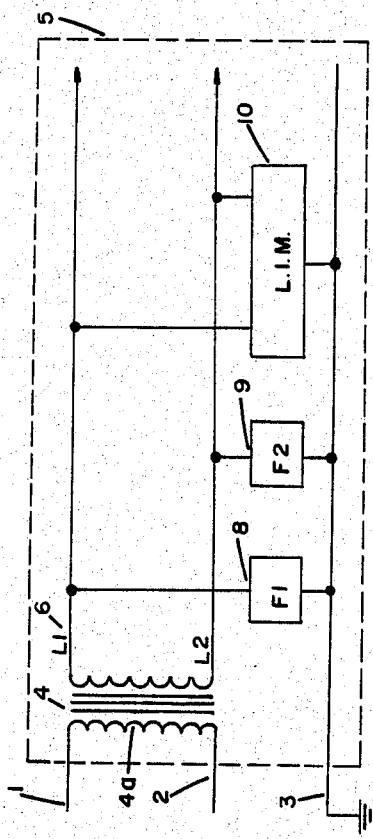
FIG. 1 is a descriptive block diagram of the ungrounded power distribution system and its connection to the building mains.

FIG. 1 is an overall view of the ungrounded power distribution system. The building mains are by convention referred to as hot, 1, and neutral, 2. The building ground is shown as 3. The neutral conductor 2 is at the same potential as the ground 3, and they are normally tied together at the service entrance. An isolation transformer 4, is used to supply power to the ungrounded power distribution system 5. This system has two conductors 6 and 7, which are by convention called $L_1$ and $L_2$ to distinguish them from a grounded system. The fault impedances distributed throughout the system can be lumped together and are represented by the total fault impedance $F_1$ on line $L_1$ and the total fault impedance $F_2$ on line $L_2$. Equipment that would be connected to this system is not shown, however, their contributed leakage is accounted for in the net values of $F_1$ and $F_2$. The line isolation monitor (LIM) 10, is shown as it would be connected to the lines $L_1$ and $L_2$ of the ungrounded power distribution system.

All faults $F_1$ from $L_1$ to ground in the ungrounded distribution system and any connected equipment, are summed in parallel and have a total admittance represented as $Y_1$. Similarly, all faults $F_2$ from $L_2$ to ground have a total admittance represented as $Y_2$. Hazard current $I_H$, is defined separately for each line, as $I_{H1}$ and $I_{H2}$. Thus, $$I_{H1} = V_L \cdot Y_2 \quad (8)$$

$$I_{H2} = V_L \cdot Y_1 \quad (9)$$

The maximum, or total, hazard current, $I_H$, is equal to the greater of $I_{H1}$ or $I_{H2}$. Therefore, $I_H$, is proportional to the greater of $Y_1$ or $Y_2$.

Figure 2:
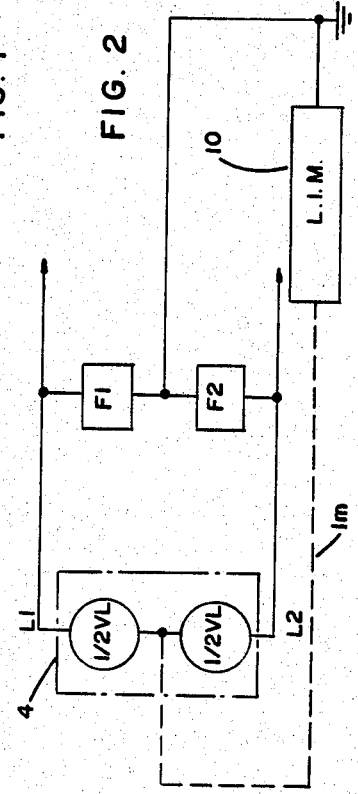
FIG. 2 is a block diagram showing the functional relationship amongst the LIM, the ungrounded power distribution system, the fault admittances, and ground.

The ungrounded distribution system and any connected equipment can be modelled by a simple admittance network. FIG. 2 represents the ungrounded system as it is monitored by the LIM 10. The isolation transformer 4 is shown for descriptive convenience, as two voltage sources $\frac{1}{2} V_L$.

Figure 5:
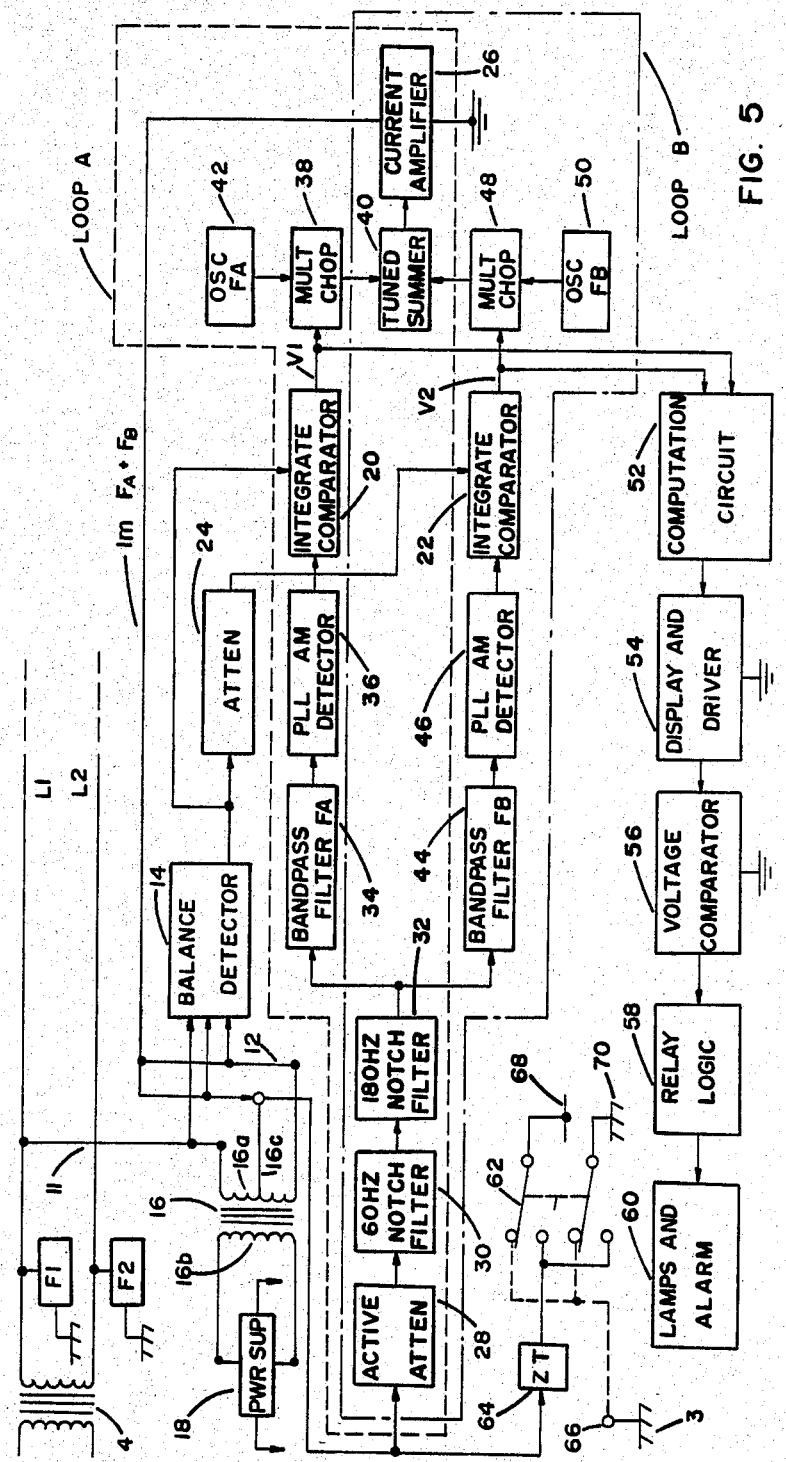

The function of the LIM is to inject a measurement current $I_M$ into the ungrounded circuit. In FIG. 2, the measurement current $I_M$ is shown for convenience as being injected at the centre point of transformer 4. In practice the measurement current $I_M$ is introduced at another point in the circuit (as shown in FIG. 5) for the sake of avoiding the use of additional connections and leads. The two faults $F_1$ and $F_2$ are by definition connected to the building ground 3, which is also the reference for the current source $I_M$ (see FIGS. 2 and 3) of the LIM 10.

Equation (6) allows the fault impedance $Y_F$ of the entire impedance network, including the LIM, to be determined. However, each of the lines $L_1$ and $L_2$ has its own fault admittance $Y_1$ and $Y_2$, respectively. The total hazard current is related to the maximum fault admittance, $Y_1$ or $Y_2$. Therefore, in order to be able to determine the maximum fault admittance, it remains to relate $Y_F$ to $Y_1$ and $Y_2$, as follows.

Figure 4:
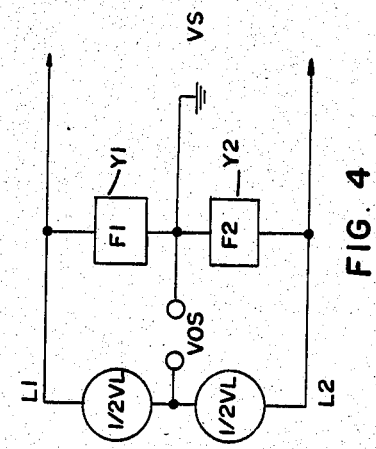
FIG. 4 is a block diagram derived from FIG. 3 showing another signal measured by the LIM, due to the measurement current of the LIM, and, FIG. 5 is a block circuit diagram of the LIM according to the invention, and its connections to the ungrounded power distribution system.

According to well known analytical methods, the network can now be reduced to (a) the parallel admittances, as seen by the LIM current source, and (b) the series admittances, as seen by the voltage source (the isolation transformer), by alternately replacing all current sources with open circuits and all voltage sources with short circuits. The resultant equivalent circuits are shown in FIGS. 4 and 3 respectively. The faults $F_1$ and $F_2$ are described as admittances having values $Y_1$ and $Y_2$ and a total value of $Y_F$.

FIG. 3 shows that the value of $/Y_F/$ as seen by the LIM current source $I_M$ is actually made up as follows:

$$/Y_F/ = /Y_1 + Y_2/. \quad (10)$$

The value that is required, to represent the maximum hazard current, is the maximum hazard admittance $/Y_{MAX}/$;

$$/Y_{MAX}/ = {}_{MAX} \text{ of } /Y_1/, /Y_2/ \quad (11)$$

$/Y_F/$ is to be scaled to represent $/Y_{MAX}/$. Since $/Y_F/$ is related to both $Y_1$ and $Y_2$, the scale factor to get $/Y_{MAX}/$ can be derived from the ratio of $Y_1$ to $Y_2$.

Referring to FIG. 4, it can be seen that $Y_1$ and $Y_2$ form a voltage divider across the line voltage $V_L$. $V_{OS}$ is the voltage offset measured between the transformer centre tap and ground. The value of $V_{OS}$ is dependent on the ratio of $Y_1$ and $Y_2$. For example, if $Y_1 = Y_2$, then $V_{OS} = 0$ volts. The other extreme would be if one of $Y_1$ or $Y_2$ was a direct short circuit, then; $/V_{OS}/ = /\frac{1}{2} V_L/$. Magnitudes are given since there would be a sign change if $Y_2$ was a short circuit and not $Y_1$. To eliminate sign changes, $Y_1$ and $Y_2$ will be referred to as $Y_{MAX}$ and $Y_{MIN}$ dependent on their relative value.

The value of $V_{OS}$ is expressed as:

$$V_{OS} = V_L \cdot \frac{Y_{MAX}}{Y_{MAX} + Y_{MIN}} - \frac{V_L}{2} \quad (12)$$

From this vector value of $V_{OS}$, we can acquire a gain factor, G, which will be the voltage control for the gain of both circuit loops that derive $Y_A$, $Y_B$. From equation 12, G is defined as follows:

$$G = \frac{V_{OS} + \frac{1}{2}V_L}{V_L} = \frac{Y_{MAX}}{Y_{MAX} + Y_{MIN}} \quad (13)$$

Therefore, the magnitude of G is;

$$/G/ = \frac{/Y_{MAX}/}{/Y_{MAX} + Y_{MIN}/} \quad (14)$$

which is applied as the gain factor to $/Y_F/$;

$$/Y_F/ \times /G/ = /Y_{MAX} + Y_{MIN}/ \times \frac{/Y_{MAX}/}{/Y_{MAX} + Y_{MIN}/} \quad (15)$$

$$\therefore /Y_{MAX}/ = /Y_F/ \times /G/. \quad (16)$$

The two primary equations that govern the response of the line isolation monitor are thus; Equ (6), to determine the value of $/Y_F/$ at the line frequency, and Equ (16) to scale $/Y_F/$ to represent $/Y_{MAX}/$.

FIG. 5 is a functional block diagram of the preferred embodiment of the line isolation monitor according to this invention. The circuits which constitute each block are not shown explicitly but the details will be apparent to one of ordinary skill in the art. It is recognized that in implementation some of the blocks may be inclusive of each other or subdivided further or performed in hardware or software logic without deviating from the spirit or intent of the present invention.

In FIG. 5, the connection to the ungrounded power distribution system is represented by two ungrounded power supply lines $L_1$ and $L_2$. It will be appreciated of course that there may be more than two such ungrounded lines, two being shown here merely for the sake of explanation only, and without limitation.

The LIM is connected to ungrounded power distribution system by means of wires 11 and 12. The LIM is also connected to the ground reference, 3 at point 66. The first portion or block of the LIM is the balance detector 14, connected to wires 11 and 12.

Power for the operation of the LIM is supplied from the lines $L_1$ and $L_2$, through transformer 16, having a primary winding 16a connected across lines $L_1$, $L_2$. The secondary winding 16b is connected to a DC power supply 18 which is in turn connected to the various components of the LIM described below.

For descriptive simplicity a balance detector 14 of relatively high impedance is shown connected directly to $L_1$ and $L_2$ by wires 11 and 12 and to the centre tap of the transformer 16. It is recognized that there are other means of configuring the balance detector 14 such that it can be connected to a secondary winding of the transformer and the primary centre tap. In this way, detector 14 can be made to handle low secondary voltages rather than high primary voltages. However, the functional representation would remain equivalent. The transformer secondary 16b can also supply low voltage AC for the indicating lamps and alarms (described below), but this connection is not shown explicitly.

Balance detector 14 is in turn connected to two separate integrator comparators 20 and 22. An attenuator 24 is connected between balance detector 14 and integrator comparator 22 for reasons to be described below.

Balance detector 14 is operable to receive signals from both lines $L_1$ and $L_2$ and to provide an output signal corresponding in magnitude to the gain factor G. In order to achieve such output, detector 14 measures the line voltages relative to a reference point (which could be for example, the transformer centre tap 16c as shown, a ground or any other suitable reference point) at that power frequency. The output signal is a DC signal proportional to the balance.

The measurement current is supplied via current amplifier 26 to the centre tap 16c of the primary winding of transformer 16. Two relatively high impedance frequency responsive signal loops indicated as loop A and loop B are also connected to the centre tap 16c. Certain components of the two loops are common and consequently loop A is shown in chain-dotted phantom lines, and loop B is shown in dot-dash phantom lines for the sake of clarity.

Loop A consists of blocks 28, 30, 32, 34, 36, 20, 38, 40, 42 and 26. Loop B consists of blocks 28, 30, 32, 44, 46, 22, 48, 40, 50 and 26. The two loops are functionally identical but are set to be selective to different frequencies $f_A$ and $f_B$. The elements 28, 30 and, 32, are responsive to both frequencies.

It will thus be understood that Loop A comprises the active attenuator 28, which is in turn connected to a first notch filter 30, set to a predetermined frequency, typically being equal to the frequency of the power distribution system and filter 30 is in turn connected to a second notch filter 32, which is set to a different frequency, which is the third harmonic frequency of the first notch filter frequency. As is well known, the third harmonic component of the power frequency is of significant amplitude.

In loop A, notch filter 32 is connected to bandpass filter 34, which is in turn connected to detector 36, and integrator comparator 20. Comparator 20 is in turn connected to chopper 38, which is connected to tuned summer 40. Chopper 38 is driven by oscillator 42 in a manner to be described below.

In loop B, the output of notch filter 32 is supplied to bandpass filter 44, detector 46, and integrator comparator 22. The output of comparator 22 is in turn supplied to a chopper 48, which is in turn connected to tuned summer 40. Chopper 48 is driven by oscillator 50.

The tuned summer 40 which is common to both loops A and B, feeds the current amplifier 26 which is also common to both loops.

The outputs of comparators 20 and 22, of loops A and B, are also supplied to computation circuit 52 which is then connected to the display and driver 54 and voltage comparator 56, relay logic 58 and finally to the lamps and alarm system 60.

In addition, the system has provision for self-testing by means of a test switch 62 and a known reference test impedance 64 that is connected to an internal ground reference, but is disconnected from the isolated power system ground reference 66. The circuit also has two separate ground references 68 and 70, tied together at the earth, so that if either ground connection is open, the system will alarm but the display will be off indicating a loss of ground.

In operation, an understanding of the function of loop A can be applied to both loops, realizing that loop B operates equivalently. In loop A, oscillator 42 drives a multiplier/chopper 38, that is modulated by the output of an integrating comparator 20, to produce an amplitude modulated square wave $W_A$ of frequency $f_A$. Simultaneously, in loop B, oscillator 50 and multiplier/chopper 48 produce a similar square wave $W_B$ of frequency $F_B$.

Tuned summer 40 receives waves $W_A$ and $W_B$. Summer 40 is tuned so that essentially the only components of waves $W_A$ and $W_B$ allowed to pass are the fundamental sinusoidal components, $S_A$ and $S_B$, respectively. In addition, summer 40 adds the sinusoidal components $S_A$ and $S_B$ to produce an output signal, which is delivered to current amplifier 26. The current amplifier 26 injects a current signal into the ungrounded distribution system, at transformer 16, that is proportional to its driving signal. The current signal passes through transformer 16 into lines $L_1$ and $L_2$, and the balance of the impedance network, including the fault impedances $F_1$ and $F_2$. As a result of such current, the voltage in lines $L_1$ and $L_2$ changes. The voltage in lines $L_1$ and $L_2$, including the response to the injected current, passes from centre tap 16C to both balance detector 14 and active attenuator 28.

Balance detector 14 provides a DC output corresponding to the gain factor G, which is a measure of the imbalance of the fault impedances $F_1$ and $F_2$. The gain signal passes to integrator comparator 20 in loop A. The gain signal also passes to attenuator 24, which simply reduces the magnitude of the DC gain signal by a fixed factor, and then to integrator comparator 22 in loop B.

More or less simultaneously, the voltage in line $L_1$ and $L_2$, including the response to the injected current, passes to active attenuator 28, which simply reduces the amplitude of the voltage signal. The signal passes through notch filters 30 and 32, removing the fundamental and third harmonic frequencies of the power signal. Thus, the signal remaining at the output of notch filter 32 is essentially only the voltage response to the measurement current injected by amplifier 26 into the impedance network.

The voltage response signal is passed to bandpass filter 34 in loop A and to bandpass 44 in loop B. Bandpass filter 34, in loop A, further separates the frequency component $f_A$ of this signal to which loop A is selective. A narrow band phase locked loop amplitude modulated detector 36 locks synchronously to the $f_A$ frequency component of the voltage response to derive a voltage level proportional to the magnitude of this frequency component. This voltage is proportional to the fault impedance magnitude at frequency $f_A$ for a fixed measurement current. The impedance voltage signal from detector 36 passes to integrating comparator 20. Comparator 20 produces a DC output proportional to the difference between the gain factor and the measured fault impedance magnitude at frequency $F_A$. Comparator 20 monitors such difference and increases or decreases its output, as the case may be, until the difference is zero. When the difference is zero, at steady state, the output of comparator 20 remains constant at a value proportional to the actual fault admittance magnitude at frequency $F_A$.

The comparator output signal is passed to the multiplier/chopper 38, which is controlled by the comparator signal. The amplitude of the square wave $W_A$ is proportional to that of the comparator signal. Accordingly, the amplitude of the frequency $F_A$ component in the measurement current is proportional to the difference in the gain factor signal and the admittance signal at frequency $F_A$.

Similarly, in loop B, the amplitude of the frequency $F_B$ component in the measurement current is proportional to the gain factor signal and the admittance signal at frequency $F_B$.

Assuming the gain voltage to be constant, the measurement current signal will increase or decrease until the impedance voltage equals the gain voltage. In effect, the amplitude of the measurement current is varied to obtain a voltage response value fixed at steady state. Therefore, the final value of each frequency component of the measurement current will be proportional to the total admittance $(Y_1+Y_2)$ of faults $F_1$ and $F_2$ at each loop's frequency.

In the complete system, two admittance voltages $V_A$ and $V_B$ are developed, at the outputs of the integrating comparators 20 and 22 that are proportional to the total fault admittance magnitudes $/Y_A/$ and $/Y_B/$ at the measurement frequencies $f_A$ and $f_B$ respectively. These voltages are presented to the computation circuit 52 to compute equation (6) and result in the value $/Y_F/$. However, as shown in equation (7) there is a proportionality constant which defines the fixed relative scaling of $/Y_A/$ to $/Y_B/$ for the measurement frequencies used. This scaling adjusts the relative sensitivity of the LIM to resistive and capacitive fault admittances. The scaling could be performed within the computation circuit 52, or equivalently by prescaling the relative gain voltages of the two circuit loops as done by attenuator 24. The output voltage $V_C$ of the computation circuit which is proportional to $/Y_F/$ must in turn be scaled to be proportional to $/Y_{MAX}/$. This proportionality for the gain of the admittance voltages produced, $V_A$ and $V_B$, is controlled by the gain voltage $V_G$ output of the balance detector 14. The balance detector responds according to equation (13) and can be implemented by a resistive bridge or transformer coil summing techniques. The net scaled admittance voltages $V_A$ and $V_B$ will equivalently scale $V_C$ to be proportional to $/Y_{MAX}/$. Therefore $V_C$ is a measure of the maximum hazard current $I_H$ and drives the display 54, and voltage comparator 56, which recognizes if the value exceeds a predetermined threshold. The voltage comparator in turn actuates relay 58 to control any indicating lamps and audible alarms 60.

It will be appreciated that the function of computation circuit 52, display and drives 54, and voltage comparator 56 could all be implemented in a software or firmware controlled computer measurement means. Signals corresponding to the gain factor G from balance detector 14 and the admittance voltages $V_A$ and $V_B$ could be inputted to the computer means. The output of the computer means would activate any necessary lamp and alarm means 60.

In summary, for all combinations of fault admittances the two loops will be responsive to the scaled magnitude of the fault admittances at the two measurement frequencies. Therefore, the displayed output of the computation circuit 52, will be proportional to the maximum total hazard current.

What is claimed is:

1. A line isolation monitor for use with an ungrounded power distribution system with conductors having fault admittances to ground, and comprising:
   current means for applying a measurement current to said system containing simultaneously at least two measurement frequency components;

frequency selective measurement means responsive to the response of the system to the measurement current at each of the frequencies of said current means, the measurement means providing output signals proportional to the fault admittances;

computation means connected to said measurement means to receive the output signals and to calculate the maximum fault admittance at the system frequency, and, display means responsive to said computation means to indicate isolation of said system from ground.

2. A line isolation monitor set forth in claim 1 wherein said current means is responsive to the output signals generated by said measurement means.

3. A line isolation monitor set forth in claim 2 further comprising a signal generating means for producing component signals at each of the measurement frequencies, the amplitude of each component signal corresponding to one of the output signals of the measurement means, a summation means for combining said component signals, said current means being responsive to said summation means for varying the measurement current applied to said system.

4. A line isolation monitor set forth in claim 3 wherein the said measurement current frequencies are different from the line voltage frequency in said system.

5. A line isolation monitor set forth in claim 3 including detector means responsive to the line voltages in said system to generate a gain signal, said gain signal being proportional to the ratio of the greater fault admittance to the summation of all fault admittances, said detector means being connected to said computation means, said computation means being responsive to said gain signal in calculating the maximum fault admittance.

6. A line isolation monitor set forth in claim 5 wherein the magnitude of said output signals of the measurement means is controlled by said gain signal.

7. A line isolation monitor set forth in claim 5 wherein said computation means is connected to means for generating an alarm in response to a predetermined maximum fault admittance.

8. A method for continuously monitoring fault admittances in an ungrounded power distribution system comprising the steps of:

applying a measurement current to said system containing simultaneously at least two frequency components;

selectively measuring the response of the system to the measurement current at each of the frequencies;

producing output signal proportional to the fault admittances;

computing the maximum fault admittance from the output signals, and, displaying the results of the computation to indicate isolation of said system from ground.

9. A method as claimed in claim 8 including the additional step of controlling the amplitude of the measurement current according to the magnitude of the output signals.

10. A method as claimed in claim 9 including the additional steps of:

generating component signals at each of the measurement frequencies, the amplitude of each component signal corresponding to the output signals;

summing the component signals, and, controlling the measurement current according to the combined component signals.

11. A method as claimed in claim 10 wherein the measurement frequencies are different from the line voltage frequency in said system.

12. A method as claimed in claim 11 including the additional step of:

detecting the line voltages in said system to generate a gain signal, said gain signal being proportional to the ratio of the greater fault admittance to the summation of all fault admittances, and, the said computation taking into account the gain signal, whereby to calculate the maximum fault admittance of said system.

13. A method as claimed in claim 12 including the additional steps of;

controlling the magnitude of the output signals according to the gain signal.

14. A method as claimed in claim 13 including the additional step of:

generating an alarm in response to a predetermined maximum fault admittance.

15. A method as claimed in claim 14 wherein there are two measurement frequency components.

16. A method as claimed in claim 8 indicating the additional step of:

detecting the line voltages in said system to generate a gain signal, said gain signal being proportional to the ratio of the greater fault admittance to the summation of all fault admittances, and, the said computation taking into account the gain signal, whereby to calculate the maximum fault admittance of said system.

17. A line isolation monitor as claimed in claim 7 wherein two measurement frequency components are used.

18. A line isolation monitor as claimed in claim 1 wherein there are two measurement frequency components.

19. A line isolation monitor as claimed in claim 18 including detector means responsive to the line voltages in said system to generate a gain signal, said gain signal being proportional to the ratio of the greater fault admittance to the summation of all fault admittances, said detector means being connected to said computation means, said computation means being responsive to said gain signal in calculating the maximum fault admittance.

* * * * *